United States Patent [19]

Furrer

[11] Patent Number: 4,517,522
[45] Date of Patent: May 14, 1985

[54] SWITCHING AMPLIFIER
[75] Inventor: Andreas Furrer, Turgi, Switzerland
[73] Assignee: BBC Brown, Boveri & Company, Limited, Baden, Switzerland
[21] Appl. No.: 501,179
[22] Filed: Jun. 6, 1983
[30] Foreign Application Priority Data
  Jun. 25, 1982 [CH] Switzerland ............... 3920/82
[51] Int. Cl.³ ............................................ H03F 3/38
[52] U.S. Cl. ................................ 330/10; 330/197; 330/251
[58] Field of Search ............. 330/10, 197, 207 A, 330/251; 336/229

[56] References Cited
U.S. PATENT DOCUMENTS 3,179,908  4/1965  Peabody .................. 336/229 X
3,266,000  8/1966  Markarian ................ 336/229
4,369,409  1/1983  Kyrian et al. .............. 330/10

Primary Examiner—James B. Mullins
Attorney, Agent, or Firm—Oblon, Fisher, Spivak, McClelland & Maier

[57] ABSTRACT

A switching amplifier for producing large output power signals, including a plurality of amplifier stages having signal inputs driven in parallel and series connected outputs. The amplifier stages amplify pulse signals representative of an input signal with as little distortion as possible in a wide frequency band, and in particular exhibit very high insulation and very low capacity. The amplifier stages therefore include switching amplifiers each including a transformer having a toroidal core of low remanence material, a secondary winding formed of plural turns of rf stranded wire wound on the toroidal core, an insulating housing surrounding the secondary winding, a primary winding formed of plural turns of rf stranded wire disposed on the insulating housing, an outer housing confining the transformer and being filled with an insulating material, and a metallic mandrel within the bore of the toroidal core.

6 Claims, 4 Drawing Figures

SWITCHING AMPLIFIER

BACKGROUND OF THE INVENTION

1. Field of the Invention

The present invention relates to a switching amplifier containing a signal converter, several amplifier stages and a low-pass filter, in which arrangement the signal converter converts the input signal to be amplified into at least two pulse sequences and each amplifier stage has at least one switching stage having a transformer, the primary winding of which can be connected by means of at least one switching element, which is controlled by one of the pulse sequences, to a supply-voltage source and the secondary winding of which, which is electrically separated from the primary winding, is connected to the secondary windings of the other switching stages to form a series circuit and in which arrangement the low-pass filter is connected to the series circuit for converting the impulse sequences amplified in the switching stages into an amplified output signal.

2. Description of the Prior Art

Switching amplifiers of the above-noted type can be constructed for high output powers with high output voltage and have the good efficiency of class D amplifiers. Compared to the hitherto conventional linear amplifiers which are fed with high voltage and have special amplifier tubes with relatively short duty cycles, switching amplifiers with comparable characteristics can be simply operated with rectified mains voltage, contain commercially available long-life semiconductor switching elements and relatively small transformers.

A tested embodiment of a switching amplifier which can be used with particular advantage as a modulator for the transmitting tube of a broadcast transmitter is described in German Offenlegungsschrift No. 2,935,445. This switching amplifier contains several amplifier stages which are operated in parallel and of which each one has two switching stages and a signal converter which converts the input signal into two pulse sequences which are phase shifted by 180° and have duration-modulated pulses. Each pulse sequence controls the switching elements in one switching stage of the amplifier stages, which enables the transformers to be prevented from saturating and 100 % modulation of the amplifier stages to be achieved. It is clear that in this operating mode, each switching stage and each transformer is excited once during each period of the pulse sequences.

In order to reduce the number of switching actions, it has also already been proposed (Swiss Application No. 992/81) to use a signal converter which converts the input signal into a plurality of pulse sequence pairs, the 180° phase shifted pulse sequences of which consist of pulses having a maximum duration which is limited by the saturation time of the transformer and in which arrangement the number of pulse sequence pairs is modulated as a function of the analog input signal.

In addition, it has already been proposed (Swiss Application No. 116/82) to use the transformer as a push-pull transformer, which makes it possible to use the two pulse sequences or one pair of pulse sequences to excite the same transformer and thus to cut the total number of transformers in the switching amplifier by half.

As can be immediately seen by any expert, in a switching amplifier the losses in the amplifier and the distortion of the output signal are decisively determined by the construction and the characteristics of the transformer, independently of the type of modulation or of the excitation of the transformer.

SUMMARY OF THE INVENTION

The present invention therefore has the basic objective of creating a switching amplifier, the transformer of which ensures an optimum transmission quality with minimum transmission losses.

According to the invention, this objective is achieved by means of a switching amplifier of the type initially mentioned, wherein each of the transformers is suitable for transmitting uni- and bi-polar pulses, and has a transmission band width of 50 Hz to 1 MHz and has between the primary and the secondary winding a dielectric strength of at least 50 kV, a coupling coefficient of at least 0.999 and a capacity of less than 250 pF, and with a modulation of 1:1 and a voltage of 500 VDC at the primary winding transfers a pulse power of at least 30 kW.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
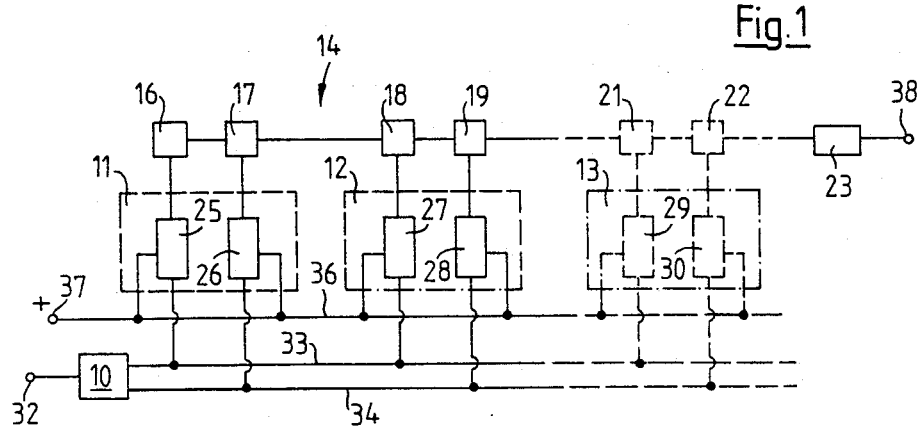
FIG. 1 is a basic diagram of a switching amplifier having several amplifier stages.

The switching amplifier shown diagrammatically in FIG. 1 contains a pulse modulator 10, a plurality of amplifier stages 11, 12 and 13, a series circuit 14 formed of several rectifier arrangements 16, 17, 18, 19 and 21, 22, and a low-pass filter 23. Each amplifier stage is associated with two switching stages 25, 26; 27, 28 or 29, 30, respectively. In addition, this switching amplifier contains an input terminal 32 for the analog input signal to be amplified, two control signal lines 33, 34 each of which connects a signal output of the pulse modulator 10 to the signal input of a switching stage in each amplifier stage, a supply voltage line 36 which connects the supply voltage source 37 to the supply voltage input of each switching stage and an output terminal 38 which is connected to the output of the low-pass filter 23 and which is intended for taking off the amplified analog output signal.

Figure 2:
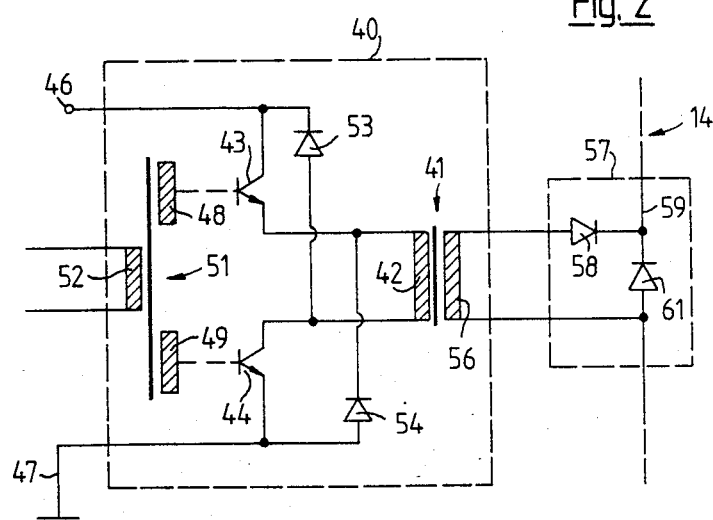
FIG. 2 is a block diagram of a switching stage for unipolar pulses.

The embodiment shown in FIG. 2 of a switching stage 40 contains a transformer 41. The connections of the primary winding 42 of the transformer are connected via switching transistors 43, 44 to a supply voltage line 46 and to a ground line 47, respectively. The control electrode of the switching transistor is connected to a secondary winding 48 or 49, respectively, of a control signal transformer 51, the primary winding 52 of which is connected to a control signal line 33 or 34, respectively, as shown in FIG. 1. In parallel with the primary winding 42 of the transformer and with one each of the switching transistors 43, 44, a diode 53 or 54, respectively, is also connected which protects the associated switching transistor against overvoltage when the current is interrupted.

The secondary winding 56 of the transformer is connected to a rectifier arrangement 57 which connects the one connection of the winding directly and the other connection via a diode 58 to the line 59 of the series circuit 14 shown in FIG. 1, which series circuit has another diode 61 between the two connecting points.

During the operation of the switching amplifier described the analag signal to be amplified is sent via the input terminal 32 to the pulse modulator 10. At the output of the pulse modulator two pulse sequences then appear, the pulses of which are duration-modulated and phase-shifted by 180°. Each pulse sequence is sent via one of the control signal lines 33 or 34, respectively, to the control signal input of one of the switching stages, for example of the switching stages 25, 27, 29 or 26, 28, 30 in the amplifier stages 11, 12 or 13, respectively. In the switching stage the pulse sequence is converted by the control signal transformer 51 into control signals for the two switching transistors 43, 44. The connection of the control electrode of the switching transistors to the secondary winding of the transformer is selected to be such that the switching transistors are switched into the conductive state for the duration of each pulse and a current flows from the supply voltage line 46 through the primary winding 42 of the transformer 41. The current induced in the secondary winding of the transformer is supplied via the rectifier arrangement 57 as a unidirectional pulse to the series circuit 14. At the input of the low-pass filter 23 a signal then appears which is the resultant of the superimposition of all unidirectional pulses generated by the switching stages and rectifier arrangements. An amplified analog signal can then be taken from the output of the low-pass filter.

This mode of operation is explained in detail in the Offenlegungsschrift mentioned in the introduction, which is why a further description will be omitted here.

A tested embodiment of this switching amplifier has been used as a modulation amplifier for a broadcast transmitter. This switching amplifier contained 48 amplifier stages each having two switching stages and made it possible, with a supply voltage of 500 VDC and a transmission ratio of 1:1.2, to generate at the end of the series circuit, that is to say at the input of the low-pass filter, pulses having a peak voltage of 28 kV and a power of 1400 kW.

For a switching amplifier with a predetermined output power and voltage, the number of amplifier or switching stages, respectively, required and the highest possible supply voltage is given by the current and the dielectric strength of the switching elements. With switching amplifiers having a high output power and voltage and a correspondingly great number of switching stages, the transformer associated with each switching stage is subject to operating conditions which are not met by the hitherto common transformers. As has already been described, the pulses transmitted by the switching stages, for example, are superimposed along the series line, which results in the voltage difference between the secondary and the primary winding of the last transformer in the series line (in FIG. 1 of the transformer in the switching stage 30) practically corresponding to the output voltage of the switching amplifier. In addition, when the current is switched on through the primary winding of the first transformer in the series line (in FIG. 1 of the transformer in switching stage 25), the current induced in the secondary winding charges up the capacity of all transformers in the series circuit but the charging current must not exceed the current permissible for the switching element or the switching elements in the primary circuit. Finally, the transformer must be suitable for transmitting a wide frequency band of, for example, from 50 Hz to 1 MHz and should have a non-linear distortion (distortion factor) which is as low as possible within the modulation limits.

Figure 4:
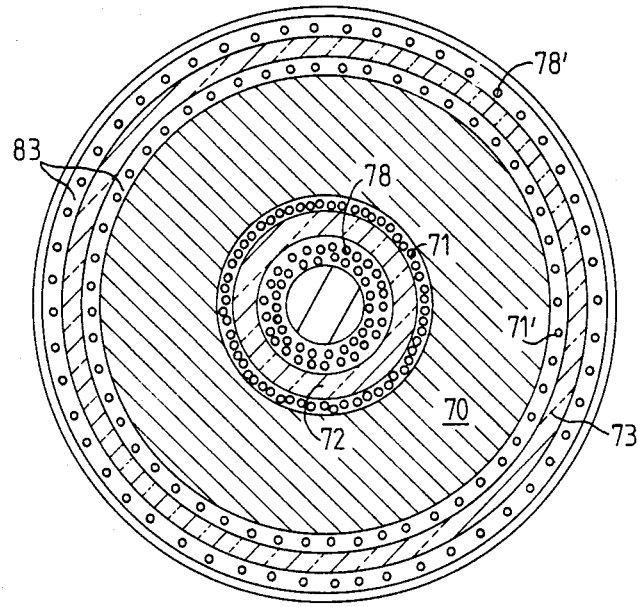
FIG. 4 is a cross-sectional view along line A—A through the transformer of FIG. 3.
Figure 3:
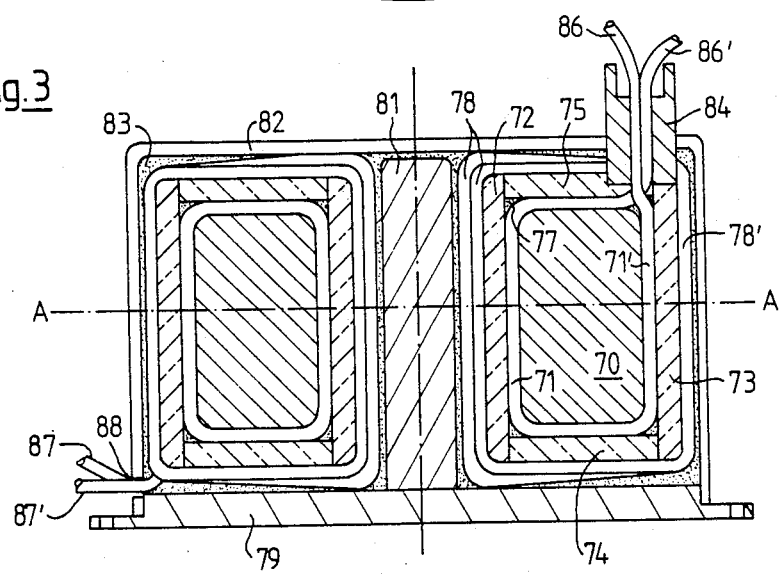
FIG. 3 is a longitudinal cross-sectional view through a tested embodiment of a transformer.

FIGS. 3 and 4 show the longitudinal section and the cross-sections through a transformer which is particularly well suited to use in a multi-stage switching amplifier with high output power. The transformer contains a floating toroidal core 70, onto which a secondary winding 71, 71' is wound. The secondary winding is enclosed by an insulating housing which consists of an inner and an outer cylinder 72 and 73, respectively, and an annular bottom and similar cover plate 74 and 75 respectively. The interior space of the housing and the space between the turns of the secondary winding is filled with an insulating compound 77. The turns of a primary winding 78, 78' are wound onto the insulating housing. The winding packet stands on a bottom plate 79 and in the cylindrical inner space enclosed by the winding packet a mandrel 81 is disposed which is joined to the bottom plate so as to provide good thermal conductivity. The winding packet is enclosed by a cover 82, the free edge of which is connected to the bottom plate. The space between the turns of the primary winding 78, 78', between the primary winding and the mandrel 81 and between the inner wall of the cover 82 is also filled with an insulating compound 83. The transformer also contains an insulating sleeve 84 for the insulated leading-in and leading-out of the two ends 86, 86' of the secondary winding, which sleeve is inserted into a hole in the cover and between two turns of the primary winding into the cover plate of the insulating housing. For leading the ends 87, 87' of the primary winding in and out an opening 88 is provided in the cover.

In an tested embodiment of the transformer described the floating core was constructed as a toroidal core of ferrite material with low remanence. The mean diameter of the toroidal core was 11 cm, the cross-sectional area 27 cm$^2$. The secondary winding wound onto the floating toroidal core consisted of approximately 40 turns of RF stranded wire with a diameter of 5 mm. For the insulating housing between the secondary and the primary winding a special casting resin was used, having a very low loss angle tg δ and a relatively large dielectric constant. The primary winding disposed on the insulating housing and thus above the secondary winding consisted of approximately 35 turns of RF stranded wire which also had a diameter of 5 mm. In order to conduct the dissipated heat away to the bottom plate, an aluminum mandrel was used equipped with a diameter of 3 cm. After the toroidal core, equipped with the windings, was inserted into the housing, the transformer was filled in a known manner in a vacuum plant with an insulating material providing high insulation.

With the transformer described, it was possible to transmit uni- and bi-polar pulses within a frequency range of from 50 Hz to 1 MHz. With a modulation of the transformer of 1:1 and with a voltage of 500 V, the pulse power was up to 30 kW. Even with high loading of the transformer the dissipated heat was well removed. The capacity between the secondary winding and the floating toroidal core provided practically no effect on the pulse transmission. There were also practically no eddy current losses because no electric screening was disposed between the primary and the secondary winding.

Naturally, a transformer with the required characteristics does not necesssarily have to have the shape shown in the Figures or the dimensions described or need to be manufactured with the materials described. For example, it is possible to use, instead of a toroidal core of one piece and of ferrite material, also a core wound of thin toroidal-core tapes or instead of the RF stranded wire described, corresponding flat tapes, or to omit the axial mandrel provided for better removal of the dissipated heat.

For amplifier stages with only one switching stage, it is possible to provide the primary winding with a center tap and to connect the two ends of the winding wire switching elements which are controlled with a 180° phase shift, to the voltage supply source. The option also exists to connect each end of the primary winding to the positive terminal of the supply voltage source by means of a first switching element and to the negative terminal by means of a second switching element and to control the switching elements enabling the current flow in the one or in the other direction in pairs. In this latter embodiment the center tap of the primary winding is not required.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A high power switching amplifier comprising:
   a signal converter which converts an input signal to be amplified into at least two pulse sequences;
   a plurality of amplifier stages, each of said amplifier stages comprising at least one switching stage for amplifying a respective pulse sequence;
   each of said switching stages comprising at least one switching element and a transformer having a primary winding connected to a supply-voltage source by means of said at least one switching element, said at least one switching element controlled by one of said two pulse sequences, and said transformer having a secondary winding connected in series with the secondary windings of the other switching stage transformers;
   a low-pass filter connected to said series circuit for converting the pulse sequences amplified in said switching stages into an amplified output signal;
   wherein each of said transformers comprises a toroidal core of low remanence material, each said secondary winding comprising plural turns of rf stranded wire wound on a respective toroidal core, an insulating housing provided around said secondary winding, said primary winding disposed on said insulating housing and comprising plural turns of rf stranded wire, an outer housing confining said transformer and being filled with an insulating material, and a metallic mandrel within a bore of said toroidal core.

2. A high power switching amplifier as claimed in claim 1, wherein the toroidal core is formed of a one piece ferrite core having a mean diameter of more than 10 cm and a cross-sectional area of more than 20 cm² and wherein the rf stranded wire of said primary and secondary windings has a diameter of approximately 5 mm.

3. A switching amplifier as claimed in claim 2, wherein each toroidal core comprises ferrite material.

4. A switching amplifier according to claim 3 wherein each of said switching-stage tranformers has a transmission bandwidth of 50 Hz to 1 MHz and has between the primary and the secondary winding a dielectric strength of at least 50 kV, a coupling coefficient of at least 0.999 and a capacity of less than 250 pF and, with a modulation of 1:1 and a voltage of 500 VDC at the primary winding, transfers a pulse power of at least 30 kW.

5. A switching amplifier as claimed in claim 2, wherein each toroidal core comprises thin toroidal-core tapes.

6. A switching amplifier according to claim 5 wherein each of said switching stage transformers has a transmission bandwidth of 50 Hz to 1 MHz and has between the primary and the secondary winding a dielectric strength of at least 50 kV, a coupling coefficient of at least 0.999 and a capacity of less than 250 pF and, with a modulation of 1:1 and a voltage of 500 VDC at the primary winding, transfers a pulse power of at least 30 kW.

* * * * *